(12) United States Patent
Choi et al.

(10) Patent No.: US 10,262,776 B2
(45) Date of Patent: Apr. 16, 2019

(54) SUPERCONDUCTOR AND METHOD OF MANUFACTURING SAME

(71) Applicant: SUNAM CO., LTD., Anseong-si, Gyeonggi-do (KR)

(72) Inventors: Kyu Han Choi, Hwaseong-si (KR); Seung Hyun Moon, Seongnam-si (KR); Soon Chul Hwang, Seoul (KR); Hun Ju Lee, Yongin-si (KR); Cheol Yeong Jang, Osan-si (KR); Woong Kwon, Gimpo-si (KR)

(73) Assignee: Sunam Co., Ltd., Anseong-si, Gyeonggi-do (KR)

( * ) Notice: Subject to any disclaimer, the term of this patent is extended or adjusted under 35 U.S.C. 154(b) by 211 days.

(21) Appl. No.: 15/021,502

(22) PCT Filed: Aug. 28, 2014

(86) PCT No.: PCT/KR2014/008044
§ 371 (c)(1),
(2) Date: Mar. 11, 2016

(87) PCT Pub. No.: WO2015/037846
PCT Pub. Date: Mar. 19, 2015

(65) Prior Publication Data
US 2016/0247608 A1 Aug. 25, 2016

(30) Foreign Application Priority Data
Sep. 11, 2013 (KR) .................. 10-2013-0109146

(51) Int. Cl.
*H01B 12/06* (2006.01)
*H01L 39/14* (2006.01)
(Continued)

(52) U.S. Cl.
CPC ............... *H01B 12/06* (2013.01); *C23C 2/08* (2013.01); *C23C 2/10* (2013.01); *C23C 14/08* (2013.01);
(Continued)

(58) Field of Classification Search
CPC ............. H01B 12/06; C23C 2/08; C23C 2/10
See application file for complete search history.

(56) References Cited

U.S. PATENT DOCUMENTS

| | | | | |
|---|---|---|---|---|
| 5,312,802 A | * | 5/1994 | Hayashi | ................ H01B 12/06 |
| | | | | 174/125.1 |
| 2005/0016759 A1 | * | 1/2005 | Malozemoff | ........... H01L 39/02 |
| | | | | 174/125.1 |

(Continued)

FOREIGN PATENT DOCUMENTS

| CN | 1813317 A | 8/2006 |
|---|---|---|
| CN | 103366894 A | 10/2013 |

(Continued)

*Primary Examiner* — Paul A Wartalowicz
(74) *Attorney, Agent, or Firm* — Lee & Morse, P.C.

(57) ABSTRACT

The present invention relates to a superconductor and a method of manufacturing the same. The superconductor comprises: a substrate having a tape shape that extends in a first direction and having surfaces which are defined as a top surface, a bottom surface, and both side surfaces; a superconductive layer positioned on the top surface of the substrate; a first stabilizing layer disposed on the superconductive layer and containing a first metal; a protective layer disposed on the first stabilizing layer and containing a second metal which is different from the first metal; and an first alloy layer disposed between the stabilizing layer and the protective layer and containing the first and second metals.

15 Claims, 2 Drawing Sheets

(51) Int. Cl.
*H01L 39/24* (2006.01)
*C23C 2/08* (2006.01)
*C23C 2/10* (2006.01)
*C23C 14/08* (2006.01)
*C23C 14/14* (2006.01)
*C23C 28/00* (2006.01)

(52) U.S. Cl.
CPC .......... *C23C 14/081* (2013.01); *C23C 14/088* (2013.01); *C23C 14/14* (2013.01); *C23C 28/321* (2013.01); *C23C 28/3455* (2013.01); *H01L 39/143* (2013.01); *H01L 39/247* (2013.01)

(56) References Cited

U.S. PATENT DOCUMENTS

| | | | |
|---|---|---|---|
| 2005/0084751 A1* | 4/2005 | Ratte | B22D 19/00 429/182 |
| 2010/0173784 A1* | 7/2010 | Lee | H01L 39/143 505/237 |
| 2012/0211475 A1* | 8/2012 | Oswald | H01L 39/2464 219/121.67 |
| 2012/0214673 A1* | 8/2012 | Usoskin | H01L 39/143 505/211 |
| 2014/0323314 A1 | 10/2014 | Takemoto | |
| 2014/0357495 A1 | 12/2014 | Daibo | |

FOREIGN PATENT DOCUMENTS

| | | |
|---|---|---|
| GB | 2 380 964 A | 4/2003 |
| JP | 2011-113933 | 6/2011 |
| JP | 2012-033281 A | 2/2012 |
| JP | 2012-216504 | 11/2012 |
| JP | 2012-216504 A | 11/2012 |
| JP | 2013-127918 | 6/2013 |
| JP | 2013-127918 A | 6/2013 |
| JP | 2013-134856 | 7/2013 |
| JP | 2013-134856 A | 7/2013 |
| RU | 2371795 C1 | 10/2009 |
| WO | WO 2013/077387 A1 | 5/2013 |
| WO | WO 2013/129568 A1 | 9/2013 |

\* cited by examiner

SUPERCONDUCTOR AND METHOD OF MANUFACTURING SAME

CROSS REFERENCE TO RELATED APPLICATIONS

This is the U.S. national phase application based on PCT Application No. PCT/KR2014/008044, filed on Aug. 28, 2014, which is based on Korean Patent Application No. 10-2013-0109146, field on Sep. 11, 2013, the entire contents of all of which are hereby incorporated by reference.

TECHNICAL FIELD

The present invention relates to a superconductor, and a method of manufacturing the same, and more particularly, to a superconductor including a protective layer that has excellent adhesive strength and flatness, and a method of manufacturing the superconductor, the method being capable of forming the protective film through a simple method.

BACKGROUND ART

An RE-123 based oxide superconductor (REBa2Cu3O7-X, RE is a rare earth element that includes Y) has superconductivity at the liquid nitrogen temperature. The RE-123 based oxide superconductor has a low current loss, and thus is formed into a Superconducting wire and manufactured as a superconducting conductor or superconducting coil for supplying electrical power. Methods for fabricating this oxide superconductor into a wire include a method in which an oxide superconducting layer is formed on a base material of a metal tape through an intermediate oxide layer and form a stabilizing layer is on the oxide superconducting layer.

According to the type, the RE-123 based oxide superconductor may be degraded by moisture, and when the Superconducting wire is stored in an environment with an abundance of moisture or left in a state in which moisture is attached to the Superconducting wire, moisture infiltrates the oxide superconducting layer to cause degradation of the superconducting properties. Therefore, in order for the Superconducting wire to achieve long-term reliability, it is necessary to employ a structure that protects the original form of the superconducting layer.

As a typical structure for protecting all of a superconducting layer, Japanese Patent Laid-open Publication No. 2009-503794 discloses a structure in which a superconducting insert having a laminated structure is covered with two layers of a conductive non-porous filler. This high temperature superconducting wire is formed by wrapping the superconductor four times with a stabilizer strip made of metal, and filling an inner portion of the stabilizing strip with the conductive non-porous filler.

Moreover, Korean Patent No. 0682582 discloses a structure in which metal tapes having a wider width than a superconducting tape are placed on a top surface and a bottom surface of the superconducting tape, and a side of the superconducting tape is filled with porous soldering fillet to attach the metal tapes located on the top surface and the bottom surface to each other.

DISCLOSURE OF THE INVENTION

Technical Problem

An object of the present invention is to provide a superconductor in which the adhesive strength of a protective layer is excellent, even with respect to a microscopically uneven surface, the flatness of the protective layer is superb such that a process of forming another material film above the protective layer is easily performed, and the adhesive strength of the other material film with respect to the protective layer is also excellent.

Another object of the present invention is to provide a method of manufacturing a superconductor, the method being capable of forming a protective layer through a simple method.

Technical Solution

A superconductor according to an exemplary embodiment of the inventive concept includes a substrate having a tape shape that extends in a first direction and having surfaces which are defined as a top surface, a bottom surface, and both side surfaces; a superconducting layer disposed on the top surface of the substrate; a first stabilizing layer disposed on the superconducting layer and containing a first metal; a protective layer disposed on the first stabilizing layer and containing a second metal which is different from the first metal; and a first alloy layer disposed between the first stabilizing layer and the protective layer, and containing the first and second metals.

The second metal may be provided inside of the first alloy layer when the protective layer is melted.

The protective layer may be disposed on both side surfaces of each of the substrate, the superconducting layer, and the first stabilizing layer, and on the bottom surface of the substrate.

The first metal of the first stabilizing layer may be any one selected from the group consisting of gold, silver, platinum, palladium, copper, and alloys thereof.

The second metal of the protective layer may be any one selected from the group consisting of tin, lead, antimony, silver, and alloys thereof.

The first alloy layer may contain an alloy of silver and tin, or an alloy of silver and lead.

The superconductor may further include a second stabilizing layer disposed on the protective layer; and a low melting point metal layer disposed between the protective layer and the second stabilizing layer, the low melting point metal layer containing a third metal which is different from the first metal and the second metal.

The low melting point metal layer may attach the second stabilizing layer to the protective layer.

The protective layer may be disposed on a top surface, a bottom surface, and both side walls of the protective layer.

The third metal of the low melting point metal layer may be any one selected from the group consisting of tin, lead, antimony, silver, and alloys thereof.

The second stabilizing layer may be any one selected from the group consisting of copper, zinc, brass, nickel, a nickel alloy, aluminum, stainless steel, and alloys thereof.

The second stabilizing layer has a tape shape.

The superconductor may further include a second alloy layer disposed between the protective layer and the low melting point metal layer, the second alloy layer containing the second metal and the third metal.

The second alloy layer may contain tin and lead.

A melting point of the third metal of the low melting point metal layer may be lower than a melting point of the second metal of the protective layer.

According to an exemplary embodiment of the inventive concept, a method of manufacturing a superconductor may include preparing a substrate having a tape shape that extends in a first direction and having surfaces which are defined as a top surface, a bottom surface, and both side surfaces; forming a superconducting layer on the top surface of the substrate; forming a first stabilizing layer on the superconducting layer, the first stabilizing layer containing a first metal; and forming a protective layer on the first stabilizing layer, the protective layer containing a second metal that is different from the first metal, wherein, the forming the protective layer includes: melting the first metal; and coating the first stabilizing layer with the molten first metal to form a first alloy layer, which contains the first and second metals, between the first stabilizing layer and the protective layer.

The molten first metal is coated on both side surfaces of each of the substrate, the superconducting layer, and the first stabilizing layer, and on the bottom surface of the substrate.

The method of manufacturing the superconductor may further include forming a low melting point metal layer on the protective layer, the low melting point metal layer containing a third metal; and bonding a second stabilizing layer on the low melting point metal layer.

The forming the low melting point metal layer may include forming a second alloy layer containing the second metal and the third metal between the protective layer and the low melting point metal layer.

The low melting point metal layer may be formed on a top surface, a bottom surface, and both side surfaces of the protective layer.

Advantageous Effects

In a superconductor of the present invention, the adhesiveness of a protective layer with respect to a microscopically uneven surface is excellent and the flatness of a surface of the protective layer is extremely excellent such that a process for forming another material film on a top surface of the protective layer is easily performed and the adhesiveness of the other material film with respect to the protective layer is also superb.

Moreover, in a method of manufacturing the superconductor of the present invention, the protective layer may be formed through a simple method. Typically, a copper plating process may be used in the forming of a typical protective layer, and the production rate thereof is several meters per minute. Conversely, using the manufacturing method of the present invention, a uniform thick film may be formed at a rate, with respect to the same thickness, of tens of meters per minute, which is larger by a factor of at least ten.

BEST MODE FOR CARRYING OUT THE INVENTION

Figure 1:
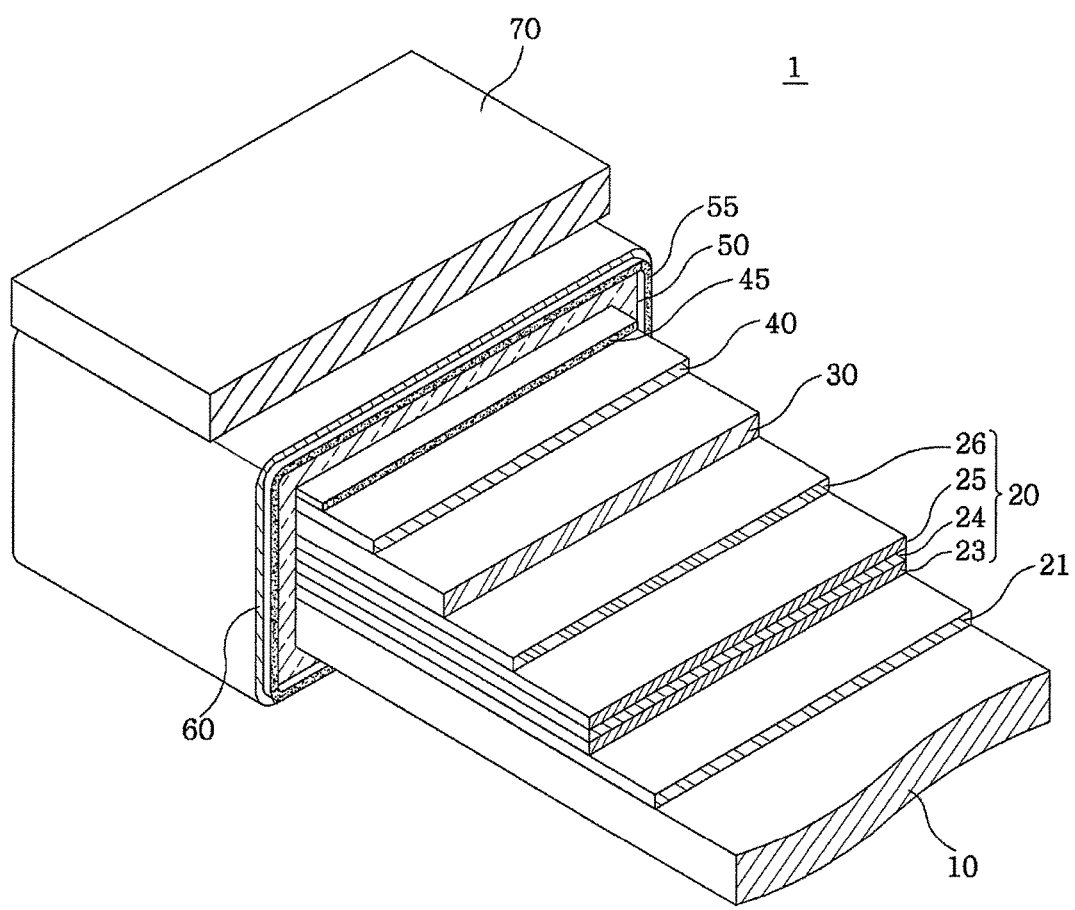
FIG. 1 is an exploded perspective view of a superconductor according to an embodiment of the present invention.

Hereinafter, the present invention is described in detail with reference to the accompanying drawings. Like reference numerals refer to like elements throughout.

In the specification, when a material film is referred to as being above another material film or substrate, the material film may be formed directly above the other material film or substrate, or yet another intervening material film may be present.

A superconductor according to an exemplary embodiment of the inventive concept includes a substrate which is in the form of a tape and has surfaces defined lengthwise as a top surface, a bottom surface, and both side surfaces, a superconducting layer disposed on the top surface of the substrate, a first stabilizing layer made of a metal and disposed on a top surface of the superconducting layer, and a protective layer made of a metal and disposed on a top surface of the first stabilizing layer, wherein a first alloy layer made of an alloy of the first metal of the first stabilizing layer and the second metal of the protective layer is further included between the first stabilizing layer and the protective layer.

Figure 2:
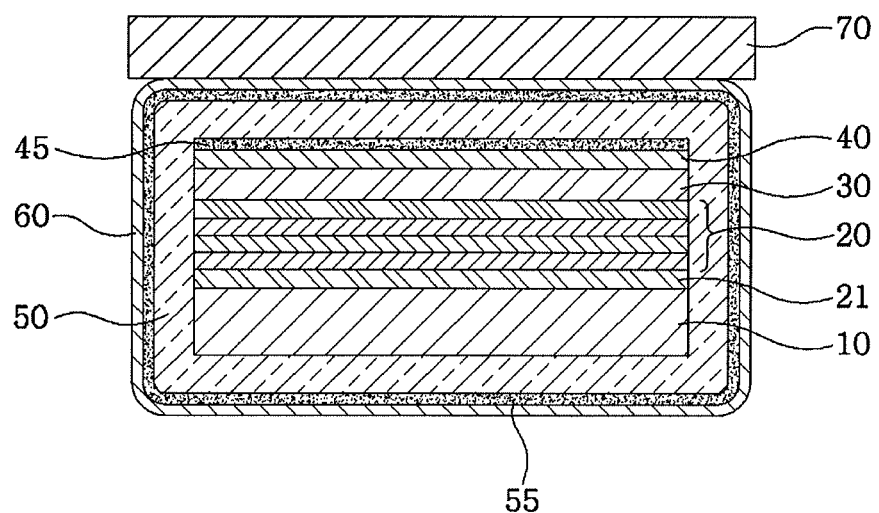
FIG. 2 is a cross-sectional view of the superconductor illustrated in FIG. 1.

FIG. 1 is an exploded perspective view of a superconductor, and FIG. 2 is a cross-sectional view of the superconductor in FIG. 1. Hereinafter, the superconductor is described with reference to FIGS. 1 and 2.

The superconductor 1 includes a substrate 10 having a tape shape that extends in a first direction and having surfaces defined as a top surface, a bottom surface, and both side surfaces, a superconducting layer 30 disposed on the top surface of the substrate 10, a first stabilizing layer 40 made of a first metal and disposed on a top surface of the superconducting layer 30, and a protective layer 50 made of a second metal different from the first metal and disposed on a top surface of the first stabilizing layer 40. The superconductor 1 selectively may further include a textured buffer layer 20.

The substrate 10 may be made of a metal or a metal alloy, and specifically, may be made of molybdenum (Mo), chrome (Cr), cobalt (Co), tungsten (W), nickel (Ni), stainless steel, or alloys thereof (for example, Hastelloy).

The substrate 10 may have the tape shape that has a high length-to-width ratio. The substrate 10 of the tape shape may have surfaces defined as the top surface, the bottom surface, and both side surfaces which are vertical in the first direction. For example, the width of the substrate 10 may be 0.4 to 10 cm, and the length of the substrate 10 may be at least 100 m, and typically, at least 500 m. Therefore, the substrate 10 may have a length-to-width ratio of at least $10^3$, or at least $10^4$. The length-to-width ratio indicates the ratio of the width of the substrate 10 to the length of the substrate 10.

The substrate 10 may be treated so as to have surface properties which are desirable for forming the superconducting layer 30. For example, a surface of the substrate 10 may be treated using a physical method such as polishing in order to obtain a desired flatness and surface roughness, and may also be treated using a chemical method such as etching.

Moreover, the substrate 10 may be treated using a roll assisted bi-axially textured substrate (RABiTS) technique, or the like, so as to be bi-axially textured. However, description below is mostly given about a case in which, instead of the substrate 10 itself being bi-axially textured, a textured buffer layer 20, which is bi-axially textured through a process such as ion beam assisted deposition (IBAD), is included.

Meanwhile, the superconductor 1 may include a diffusion preventing film 21 disposed on the substrate 10. The diffusion preventing film 21 may be made of a metal oxide such as magnesium oxide, and the diffusion preventing film 21 may desirably be formed through physical vapor deposition. The metal oxide may be stoichiometrically deficient in oxygen. The metal oxide may be a magnesium oxide, and in this case, the metal oxide may be represented by $MgO1-x$ (here, 0<x<1). The diffusion preventing film 21 formed through the physical vapor deposition may be a crystalline (for example, monocrystalline, polycrystalline, or microcrystalline) film. The diffusion preventing film 21 may directly contact the top surface of the substrate 10.

The textured buffer layer 20 is a film which provides a bi-axial texture appropriate for forming the superconducting layer 30 having a desirable crystallographic orientation. The textured buffer layer 20 includes a seed layer 23, a template layer 24 and a buffer layer 25.

The seed layer 23 may be formed on the substrate 10 or the diffusion preventing film 21. The seed layer 23 performs the role of providing a nucleation surface of the template layer 24, and performs the role of dividing the template layer 24 from the substrate 10 when the diffusion preventing film 21 is excluded. The seed layer 23 is usually formed from an oxide such as yttrium oxide, but may also be formed from a non-oxide such as silicon nitride. The seed layer 23 may be formed using chemical vapor deposition (CVD) or a physical vapor deposition method which includes sputtering, but the present invention is not limited thereto.

The template layer 24 performs the role of providing a bi-axial texture to the superconducting layer 30. That is, the template layer 24 is a bi-axially textured layer with a crystal texture that is typically aligned along crystal axes in both the in-plane and the out-plane of the film. Such a bi-axial texture may be formed using ion beam assisted deposition (IBAD), but the present invention is not limited thereto. The template layer 24 may be made of magnesium oxide, the magnesium oxide being the metal oxide which can most easily be used as a material for IBAD.

The buffer layer 25 performs the role of improving the bi-axially textured property of the template layer 24. For example, the buffer layer 25 may be made of a homoepitaxial metal oxide, and this is effective for increasing the IBAD thickness of the template layer 24. The buffer layer 25 may be prepared with a material, such as magnesium oxide, which is the same as the material used in the template layer 24 or with a material that is compatible with the same, and desirably, may be prepared using ion beam deposition, but the present invention is not limited thereto.

Meanwhile, lattice mismatch may exist between the magnesium oxide, which forms most of the template layer 25, and the material in the superconducting layer 30. In order to reduce such lattice mismatch, the textured buffer layer 20 selectively may further include a capping layer 26 disposed on the buffer layer 25. That is, the capping layer 26 may improve the lattice match and the chemical properties of the superconducting layer 30 and the template layer 25. For example, the capping layer 26 may be made of a perovskite-structured ceramic material such as yttria-stabilized zirconia (YSZ), strontium ruthenate, lanthanum manganite, or strontium titanate (STO, SrTiO3). The capping layer 26 may be formed through various physical vapor deposition techniques, but the present invention is not limited thereto.

The superconducting layer 30 may be disposed on the textured buffer layer 20. The superconducting layer 30 may have bi-axially textured properties due to the textured buffer layer 20.

The superconducting layer 30 may be arbitrarily selected from among high temperature superconducting materials which typically exhibit superconducting properties at the liquid nitrogen temperature, which is 77 K, or higher. Such materials may include $YBa_2Cu_3O_{7-x}$, which is represented by $REBa_2Cu_3O_{7-x}$ (RE being a rare earth element), $Bi_2Sr_2Ca_2Cu_3O_{10+y}$, $Ti_2Ba_2Ca_2Cu_3O_{10+y}$, and $HgBa_2Ca_2Cu_3O_{8+y}$, and desirably, $YBa_2Cu_3O_{7-x}$, which is also called YBCO, may be used. Here, 0<x<1, and 0<y<1.

The superconducting layer 30 may be formed through one of various techniques typically used for forming a thin film. For example, a thin film physical vapor deposition technique such as reactive coevaporation (RCE) or pulsed laser deposition (PLD) may be used for a high deposition rate, or chemical vapor deposition (CVD) may be used for low cost and a large surface area treatment. In addition, co-evaporation, laser ablation, metal organic deposition, or sol-gel methods, and the like, may also be used.

Typically, the superconducting layer 30 may have a thickness of 1 to 30 μm, desirably 2 to 20 μm, and more desirably 2 to 10 μm in order to obtain a desirable ampere rating.

The first stabilizing layer 40 may be disposed on the top surface of the superconducting layer 30 in order to protect the superconducting layer 30. The first stabilizing layer 40 enables an electrical charge to be by-passed and thus continuously flow when cooling of the superconductor 1 is not achieved or the critical current density is exceeded, and performs the role of preventing a coolant from infiltrating the superconducting layer 30 to thereby degrade the superconducting layer 30.

For efficiency, the first stabilizing layer 40 may be made of a metal selected from the group consisting of gold (Au), silver (Ag), platinum (Pt), palladium (Pd), copper (Cu), and alloys thereof, and desirably, may be made of a precious metal such as silver. Accordingly, for reasons of cost the first stabilizing layer 40 is typically formed to be thinner than the protective layer 50. The first stabilizing layer 40 may desirably be formed through a physical vapor deposition technique such as DC magnetic sputtering, but the present invention is not limited thereto.

The protective layer 50 is disposed on the top surface of the first stabilizing layer 40. Moreover, the protective layer 50 may be formed to surround a top surface, a bottom surface, and both side surfaces of a laminate that includes the substrate 10, the superconducting layer 30, and the first stabilizing layer 40. Referring to FIG. 2, the protective layer 50 surrounds the superconducting layer 30 in a sealing manner, and specifically, surrounds the superconducting layer 30 so as to seal the upper surface and both side surfaces of the superconducting layer 30. For this, the protective layer 30 may be formed so as to cover the top surface of the first stabilizing layer 40 and the bottom surface of the substrate 10, and to also cover the side surfaces that connect the top surface of the first stabilizing layer 40 to the bottom surface of the substrate 10.

Like the first stabilizing layer 40, the protective layer 50 also enables the electrical charge to be by-passed and thus continuously flow when cooling of the superconductor is not achieved or the critical current density is exceeded, and performs the role of preventing the coolant from infiltrating the superconducting layer 30 to thereby degrade the superconductor layer 30.

Meanwhile, the superconductor 1 further includes a first alloy layer 45 between the first stabilizing layer 40 and the protective layer 50.

The protective layer 50 is formed by coating the laminate composed of the substrate 10, the superconducting layer 30, and the first stabilizing layer 40 with a molten second metal, and accordingly, the first alloy layer 45 made of an alloy of the first metal of the first stabilizing layer 40 and the second metal of the protective layer 50 is formed at the interface between the first stabilizing layer 40 and the protective layer 50.

Typically, the protective layer 50 is formed by using an intermediate adhesive material such as a solder or a flux to attach a copper tape on the superconducting layer 30, or through a physical vapor deposition technique, typically sputtering. However, for a method that uses the intermediate adhesive material such as a solder, the adhesiveness of the protective layer 50 is poor, the production cost is expensive, and mass production is economically disadvantageous. In the present invention, by coating the molten second metal to form the protective layer 50, the first alloy layer 45 made of the alloy of the first metal of the first stabilizing layer 40 and the second metal of the protective layer 50 is formed such that the interfacial adhesiveness is improved. Moreover, a surface of the first stabilizing layer 40 is not microscopically flat, but the first alloy layer 45 percolates into the uneven surface of the first stabilizing layer 40 to improve the adhesiveness between the first stabilizing layer 40 and the protective layer 50. In addition, the protective layer 50 formed through the above method has an extremely flat surface such that a process for forming another material film on the protective layer is easily performed, and the adhesiveness of the other material film with respect to the protective layer 50 is also excellent.

The second metal of the protective layer 50 is a metal that can be melted at a temperature which is not excessively high, and one selected from the group consisting of tin, lead, antimony, silver, and alloys thereof may be desirably used. When considering the efficiency, production cost, and the like, of the protective layer, tin may be more desirably used.

Accordingly, the first alloy layer 45 may be an alloy of the first metal selected from the group consisting of gold, silver, platinum, palladium, copper, and alloys thereof; and the second metal selected from among the group consisting of tin, lead, antimony, silver, and alloys thereof. In particular, when the first metal of the first stabilizing layer 40 is silver and the second metal of the protective layer 50 is tin or lead, the first alloy layer 45 may be made of an alloy of silver, and lead or tin.

Meanwhile, the superconductor 1 may further include a second stabilizing layer 70 disposed on a top surface of the protective layer 50. Moreover, the second stabilizing layer 70 may not only be disposed on the top surface of the protective layer 50, but may also be disposed below the bottom surface of the substrate 10, and may also be disposed both on the top surface of the protective layer 50 and below the bottom surface of the substrate 10.

Like the first stabilizing layer 40, the second stabilizing layer 70 also performs the role of by-pass and of preventing the infiltration of the coolant. The second stabilizing layer 70 may be any one selected from the group consisting of copper, zinc, brass, nickel, a nickel alloy, aluminum, stainless steel, and alloys thereof, and with respect to cost, brass, which is an alloy of copper and zinc, may be desirably used. The brass may include small amounts of lead, iron, tin, or phosphorus, and the like. As the nickel alloy, Hastelloy, which is an alloy that has nickel as the main component and includes small amounts of tungsten, molybdenum, cobalt, chrome, manganese, iron, carbon, or titanium, and the like, may be desirably used. Stainless steel collectively refers to corrosion resistant steel made for improving the biggest shortcoming of iron, that is, an insufficient resistance to corrosion, and may include iron as the main component and small amounts of carbon, silicon, manganese, phosphorus, sulfur, nickel, or chrome, and the like.

The second stabilizing layer 70 may be a metal having a tape shape and have surfaces defined as a top surface, a bottom surface, and both side surfaces. In this case, the second stabilizing layer 70 may be attached to the top surface of the protective layer 50 by a low melting point metal layer 60 disposed between the protective layer 50 and the second stabilizing layer 70.

The low melting point metal layer 60 may be formed by coating the top surface of the protective layer 50 with a molten low melting point metal. Here, since a top surface, a bottom surface, and both side surfaces of the laminate that includes the substrate 10, the superconducting layer 30, the first stabilizing layer 40, and the protective layer 50 are coated with the molten low melting point metal such that the low melting point metal layer 60 surrounding the top surface, the bottom surface, and both side surfaces of the laminate is formed, the protective layer 50 may be sealed by being surrounded by the low melting point metal layer 60. Referring to FIG. 2, the low melting point metal layer 60 may not only be coated on the top surface of the protective layer 50, but also on the top surface, the bottom surface, and both side surfaces of the laminate which includes the substrate 10, the superconducting layer 30, the first stabilizing layer 40, and the protective layer 50.

The second stabilizing layer 70 may be attached on the low melting point metal layer 60 over the top surface of the protective layer 50 before the molten low melting point metal hardens. The second stabilizing layer 70 is fixed on the low melting point metal layer 60 after the molten low melting point metal hardens.

The superconductor 1 further includes a second alloy layer 50 disposed between the protective layer 50 and the low melting point metal layer 60 and made of an alloy of the second metal of the protective layer 50 and the third metal of the low melting point metal layer 60. The third metal of the low melting point metal layer 60 is different form the second metal of the protective layer 60. The second alloy layer 55 is formed by coating the top surface of the protective layer 50 with the molten low melting point metal, and accordingly, is made of the alloy of the second metal of the protective layer 50 and the third metal of the low melting point metal layer 60.

The adhesiveness between the protective layer 50 and the low melting point metal layer 60 is improved by forming the second alloy layer 55 between the protective layer 50 and the low melting point metal layer 60.

As the third metal capable of forming the low melting point metal layer 60, a metal capable of melting at a low temperature and selected from the group consisting of tin, lead, antimony, silver, and alloys thereof may be desirably used. It is desirable for a metal having a lower melting temperature than the second metal of the protective layer 50 to be selected as the third metal of the low melting point metal layer 60. This is because the melting temperature of the third metal of the low melting point metal layer 60 must be lower than the melting temperature of the second metal of the protective layer 50 in order to prevent the second metal of the protective layer 50 from melting when the top surface of the protective layer 50 is coated with the molten low melting point metal. For example, the second metal of the protective layer 50 may be tin, and the third metal of the low melting point metal layer 60 may be lead having a lower melting point than the tin, and in this case, the second alloy layer 55 may be made of an alloy of tin and lead.

The superconductor 1 may be manufactured through operations of preparing the substrate 10 which is in the form of a tape and has surfaces defined as the top surface, the bottom surface, and both side surfaces; forming the superconducting layer 30 on the top surface of the substrate 10; forming the first stabilizing layer 40 made of a metal on the top surface of the superconducting layer 30; and forming the protective layer 50 made of a metal by coating the top surface of the first stabilizing layer 40 with the molten second metal.

Descriptions for each of the operations are the same as the descriptions given in the descriptions about the superconductor 1, and thus repeated descriptions thereof are excluded here.

However, in the forming of the protective layer 50, the top surface of the first stabilizing layer 40 is coated with the molten second metal to form the first alloy layer 45 made of the alloy of the first metal of the first stabilizing layer 40 and the second metal of the protective layer 50 between the first stabilizing layer 40 and the protective layer 50.

Here, in the forming of the protective layer 50, the top surface, the bottom surface, and both side surfaces of the laminate that includes the substrate 10, the superconducting layer 30, and the first stabilizing layer 40 may also be coated with the molten second metal such that the protective layer 50 surrounds the top surface, the bottom surface, and both side surfaces of the laminate.

A method for coating the laminate with the molten second metal may include dropping the molten second metal on the laminate, or dipping the laminate in a molten second metal in a simple manner. The dipping may be realized at 100 to 300° C. for 1 to 120 seconds, desirably at 150 to 250° C. for 1 to 60 seconds. Afterwards, the laminate coated with the molten second metal may be cooled at 0 to 250° C. for 0 to 120 minutes, desirably at 0 to 100° C. for 0 to 60 minutes, and more desirably at 0 to 50° C. for 0 to 10 minutes to form the protective layer 50.

The method of manufacturing the superconductor 1 may further include attaching the second stabilizing layer 70 to the top surface of the low melting point metal layer 60 while forming the low melting point metal layer 60 by coating the top surface of the protective layer 50 with the molten low melting point metal.

In the attaching of the second stabilizing layer 70, the top surface of the protective layer 30 may be coated with the molten low melting point metal to form the second alloy layer 55 made of the alloy of the second metal of the protective layer 50 and the third metal of the low melting point metal layer 60.

Here, the top surface, the bottom surface, and both side surfaces of the laminate that includes the substrate 10, the superconducting layer 30, the first stabilizing layer 40, and the protective layer 30 may also be coated with the molten low melting point metal to form the low melting point metal layer 60 that surrounds the top surface, the bottom surface, and both side surfaces of the laminate.

A method for coating the laminate with the molten low melting point metal may include dropping the molten low melting point metal on the laminate, or dipping the laminate in a molten low melting point metal solution, in a simple manner. The dipping may be realized at 150 to 400° C. for 1 to 220 seconds, desirably at 150 to 350° C. for 1 to 10 seconds, and more desirably at 150° C. to 320° C. for 1 to 5 seconds. After the laminate coated with the molten low melting point metal is taken out of the molten low melting point metal solution and attached to the second stabilizing layer 70, the laminate may be cooled at 0 to 400° C. for 1 to 20 minutes, desirably at 0 to 250° C. for 0 to 60 minutes, and more desirably at 0 to 50° C. for 0 to 10 minutes to form the low melting point metal layer 60.

MODE FOR CARRYING OUT THE INVENTION

Hereinafter, an exemplary embodiment of the inventive concept is described in detail to allow the present invention to be easily carried out by a person with ordinary skill in the art. However, the present invention may be embodied in various different forms, and is not limited to embodiments described herein.

EXAMPLE

Manufacturing of Superconductor

Example 1

An amorphous diffusion preventing film made of aluminum oxide (Al2O3) was formed on a Hastelloy substrate using a sputtering method. A seed layer made of yttrium oxide (Y2O3) was formed on the diffusion preventing film using a sputtering method. A template layer made of magnesium oxide was formed on the seed layer using an ion beam assisted deposition (IBAD) method. A buffer layer made of magnesium oxide was formed on the template layer using an ion beam deposition method. A capping layer made of lanthanum manganite (LMO) was formed on the buffer layer using a sputtering method.

In order to form a superconducting layer, a ceramic precursor film was formed by providing a metallic vapor, which was generated by emitting an electron beam on a container containing gadolinium (Gd), copper (Cu), and barium (Ba), on the substrate on which the buffer layer was formed, and then heat treated.

A DC magnetron sputtering method was used to form a first stabilizing layer made of silver on the superconducting layer that was formed.

The substrate having the superconducting layer formed thereon was dipped for 2 seconds in a 230° C. tin melt and then cooled to form a protective layer having a thickness of 20 μm.

The substrate having the protective layer formed thereon was dipped for 3 seconds in a 250° C. lead alloy melt and taken out, and then, after attaching brass which is in the form of a tape, was cooled in air at 50° C. for 30 seconds to form a low melting point metal layer and a second stabilizing layer.

By grinding a surface of the manufactured superconductor, it was observed through energy-dispersive x-ray spectroscopy (EDS) analysis that a first alloy layer was formed between the first stabilizing layer and the protective layer, and a second alloy layer was formed between the protective layer and the low melting point metal layer.

As a result of the observation, it was confirmed that the first alloy layer was made of an alloy of silver and tin, and the second alloy layer was made of an alloy of tin and a lead alloy.

Experimental Example 1

Evaluation of Superconductor Properties

A Superconducting wire having a width of 12 mm was manufactured with the superconductor manufactured in the above Example, immersed in 77 K liquid nitrogen under atmospheric pressure (for 5 minutes in a thermal equilibrium state), and then, after repeatedly drying for 100 cycles, as a result of evaluating the properties of the superconductor, widening of the side surfaces and the occurrence of external defects to parts, and the like, were absent, and it was also confirmed that there were no changes in the properties of the superconducting layer.

Although exemplary embodiments of the present invention have been described in detail above, the present invention is not limited thereto, and various changes and modifications made by a person with ordinary skill in the art using the basic concepts of the present invention as defined in the following claims are also within the scope of the present invention.

INDUSTRIAL APPLICABILITY

The present invention may provide a superconductor in which the adhesiveness of a protective layer with respect to a microscopically uneven surface is excellent and the flatness of a surface of the protective layer is extremely excellent such that a process for forming another material film on a top surface of the protective layer is easily performed and the adhesiveness with respect to the protective layer is also superb.

The invention claimed is:

1. A superconductor, comprising:
a substrate having a tape shape that extends in a first direction and having surfaces which are defined as a top surface, a bottom surface, and opposing side surfaces;
a superconducting layer disposed on the top surface of the substrate;
a first stabilizing layer disposed on the superconducting layer and containing a first metal;
a protective layer disposed on the first stabilizing layer and containing a second metal which is different from the first metal;
a first alloy layer disposed between the first stabilizing layer and the protective layer, and containing the first and second metals, wherein the protective layer is in contact with opposing side surfaces of each of the substrate, the superconducting layer, the first stabilizing layer and the first alloy layer, and the bottom surface of the substrate, wherein the protective layer surrounds the substrate, the superconducting layer, the first stabilizing layer and the first alloy layer;
a low melting point metal layer disposed on the protective layer, the low melting point metal layer surrounding the protective layer and containing a third metal which is different from the first metal and the second metal; and
a second alloy layer disposed between the protective layer and the low melting point metal layer, the second alloy layer surrounding the protective layer and being surrounded by the low melting point metal layer, the second alloy layer containing the second metal and the third metal.

2. The superconductor of claim 1, wherein the second metal is provided inside of the first alloy layer when the protective layer is melted.

3. The superconductor of claim 1, wherein the first metal of the first stabilizing layer is any one of gold, silver, platinum, palladium, copper, and alloys thereof.

4. The superconductor of claim 1, wherein the second metal of the protective layer is any one of tin, lead, antimony, silver, and alloys thereof.

5. The superconductor of claim 1, wherein the first alloy layer contains an alloy of silver and tin, or an alloy of silver and lead.

6. The superconductor of claim 1, further comprising a second stabilizing layer disposed on the low melting point layer, wherein the low melting point metal layer bonds the second stabilizing layer to the protective layer.

7. The superconductor of claim 1, wherein the low melting point metal layer is disposed on a top surface, a bottom surface, and opposing side surfaces of the protective layer.

8. The superconductor of claim 1, wherein the third metal of the low melting point metal layer is any one of tin, lead, antimony, silver, and alloys thereof.

9. The superconductor of claim 1, further comprising a second stabilizing layer disposed on the low melting point layer, wherein the second stabilizing layer is any one of copper, zinc, brass, nickel, a nickel alloy, aluminum, stainless steel, and alloys thereof.

10. The superconductor of claim 1, further comprising a second stabilizing layer disposed on the low melting point layer, wherein the second stabilizing layer has a tape shape.

11. The superconductor of claim 1, wherein the second alloy layer contains tin and lead.

12. The superconductor of claim 1, wherein a melting point of the third metal of the low melting point metal layer is lower than a melting point of the second metal of the protective layer.

13. A method of manufacturing a superconductor, the method comprising:
preparing a substrate having a tape shape that extends in a first direction and having surfaces which are defined as a top surface, a bottom surface, and opposing side surfaces;
forming a superconducting layer on the top surface of the substrate;
forming a first stabilizing layer on the superconducting layer, the first stabilizing layer containing a first metal; and
forming a protective layer on the first stabilizing layer, the protective layer containing a second metal that is different from the first metal, wherein,
the forming the protective layer includes:
melting the first metal; and
coating the first stabilizing layer with the molten first metal to form a first alloy layer, which contains the first and second metals, between the first stabilizing layer and the protective layer, and
the protective layer is formed to be in contact with opposing side surfaces of each of the substrate, the superconducting layer, and the first stabilizing layer, and the bottom surface of the substrate, the protective layer surrounding the substrate, the superconducting layer, the first stabilizing layer and the first alloy layer;
forming a low melting point metal layer on the protective layer, the low melting point metal layer surrounding the protective layer and containing a third metal;
forming a second alloy layer that is disposed between the protective layer and the low melting point metal layer, the second alloy layer surrounding the protective layer and being surrounded by the low melting point metal layer, the second alloy layer containing the second metal and the third metal.

14. The method of claim 13, wherein the forming the low melting point metal layer includes forming a second alloy layer containing the second metal and the third metal between the protective layer and the low melting point metal layer.

15. The method of claim 13, wherein the low melting point metal layer is formed on a top surface, a bottom surface, and opposing side surfaces of the protective layer.

* * * * *